Figure 1:
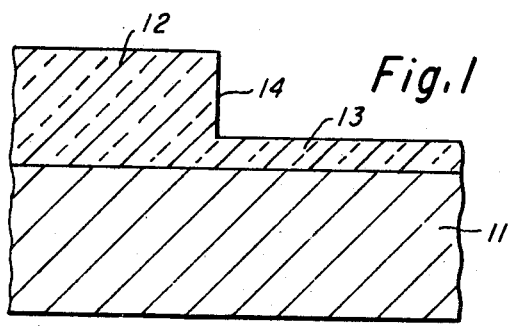

United States Patent [19]

Fu

[11] 4,358,340
[45] Nov. 9, 1982

[54] SUBMICRON PATTERNING WITHOUT USING SUBMICRON LITHOGRAPHIC TECHNIQUE

[75] Inventor: Horng-Sen Fu, Sunnyvale, Calif.

[73] Assignee: Texas Instruments Incorporated, Dallas, Tex.

[21] Appl. No.: 168,875

[22] Filed: Jul. 14, 1980

[51] Int. Cl.³ ............................................. H01L 21/283
[52] U.S. Cl. ..................................... 156/643; 29/571;
156/647; 156/652; 156/653; 156/656; 156/657;
156/659.1; 427/85; 427/86; 427/88; 427/93;
427/95
[58] Field of Search ............... 156/643, 647, 652, 653,
156/656, 657, 659.1; 427/86, 88, 93, 95; 29/571

[56] References Cited
U.S. PATENT DOCUMENTS

| | | | |
|---|---|---|---|
| 4,209,349 | 6/1980 | Ho | 156/643 |
| 4,209,350 | 6/1980 | Ho | 156/643 |
| 4,256,514 | 3/1981 | Pogge | 156/643 |
| 4,267,011 | 5/1981 | Shibata | 156/643 |

OTHER PUBLICATIONS

Jackson et al., "A Novel Submicron Fabrication Technique" Int. Electronic Device Meeting, Technical Abstracts, Dec. 1-3, 1979 Washington D. C.

*Primary Examiner*—John D. Smith
*Attorney, Agent, or Firm*—Gary Honeycutt; Melvin Sharp; James T. Comfort

[57] ABSTRACT

A method for the fabrication of submicron devices, without the use of submicron lithography. Vertical "zero undercut" etching techniques are employed, in order to convert the submicron thickness of a deposited thin film conductor layer and a thin film insulation layer into submicron gate widths that can be used in a wide variety of devices, including MOS field effect devices, for example. The conversion is achieved by depositing a thin film conductor layer of submicron thickness across a vertical step between adjacent insulator surfaces, and then vertically etching until the only remaining portion of the conductor layer is that portion adjacent the vertical step. The remaining insulation not covered by conductor is then removed. Thus, an insulated gate is provided having a submicron width approximately equal to the thickness of the conductor layer as initially deposited.

10 Claims, 5 Drawing Figures

SUBMICRON PATTERNING WITHOUT USING SUBMICRON LITHOGRAPHIC TECHNIQUE

This invention relates to fabrication techniques for obtaining micron or submicron line widths or other submicron patterns useful in the fabrication of microelectronic devices, including field effect transistor (FET) gates, for example.

During the past several years there has been a continuing trend toward the development of microelectronic devices having ever greater density. Particularly in the area of MOS memories and microprocessors, the need has continued to achieve increased density of active elements, which has led to dramatically increased operational speeds.

In memories, for example, the number of bits of storage per chip has increased from 16 to over 65,000 while the cost per bit has decreased by a factor of about 200. Thus, the cost per function has been greatly reduced while the functional complexity for a chip of a given size has greatly increased.

A major reason for this progress has been the development of ever smaller more reliable field effect structures, coupled with more sophisticated design techniques. Most of the expense in producing semiconductor devices is incurred in the testing, handling, bonding and packaging processes rather than in the cost of the semiconductor itself. Thus, any circuit which can be contained on a chip of a given size will cost about the same as any other. So long as reasonable yields are achieved, large economies in the cost per circuit element can result by increasing the number of circuit elements per unit of chip area.

Conventional photolithographic techniques have reached the limit of their ability to provide smaller geometries. Accordingly, there has been intense development activity in the area of electron beam lithography, which is known to have a capability to reduce device geometries beyond the limits of conventional photolithography. However, e-beam lithography cannot provide resolutions that are satisfactory for producing geometries in the submicron range. Accordingly, there is a continuing need for new techniques that are capable of providing submicron resolutions consistent with the yields that are required for economic feasibility.

It is therefore an object of the present invention to fabricate microelectronic structures having micron or submicron line widths, necessary to increase circuit densities beyond the limits of conventional lithographic techniques.

A more specific object of the present invention is to reduce the gate of a field effect device to micron or submicron lengths; and to do so without micron or submicron lithography. Similarly, the gate of a charge-coupled device (CCD), or other insulated gate devices, can be patterned to submicron lengths in accordance with the invention.

One aspect of the invention is embodied in a method for the fabrication of an insulated gate microelectronic device, beginning with the step of forming an adherent insulation layer on a semiconductor substrate. A portion of the insulation layer is then selectively thinned to provide a substantially vertical step at the location where the resulting thin portion adjoins the original thick portion. By "selectively thinning" it is intended to include the more practical alternative of completely removing a selected portion of the insulator, and then regrowing a thin layer of insulator to partially replace the removed portion, thereby ensuring good quality insulation.

A conductor film of micron or submicron thickness is then deposited on and near the vertical step thus formed in the insulation layer. A portion of the conductor film covering the vertical step is then thinned until the only portion thereof which remains in the vicinity of the step is a narrow section directly adjacent the step, on the thin portion of the insulation layer. Then, using the remaining conductor as a mask, the insulation film not covered by the conductor is selectively removed.

Subsequently, a device is completed, using such an insulated gate. For example, a field effect transistor is completed by implanting or diffusing source and drain regions on opposite sides of the gate, followed by the formation of suitable contact electrodes.

Generally, it is preferred to carry out the etching steps of the method in such a manner as to reduce or eliminate undercutting. That is, an anisotropic etching technique is preferred so that vertical sidewalls are achieved in each of the etching steps. Specifically the step of thinning the deposited insulation layer is carried out with the use of an anisotropic etch so that the resulting step between thick and thin insulation areas will be substantially free of undercutting, i.e., as nearly perpendicular to the substrate as is practically feasible. Also, the subsequent step of thinning the conductor film is preferably carried out with an anisotropic etch so that completion of the thinning step will insure that the remaining conductor has substantially perpendicular sidewalls. And finally, when the remaining conductor is employed as an etch mask, the use of an anisotropic etch is preferred in the removal of surrounding insulation layer so that substantially perpendicular sidewalls are achieved, coplanar with the sidewalls of the conductor.

When the above sequence of steps is employed for the fabrication of an MOS field effect device, the substrate is preferably silicon; the insulation layer is preferably silicon dioxide; the deposited conductor film is preferably aluminum or polysilicon crystalline; and in the case of polycrystalline silicon its conductivity is adjusted by suitable doping, for example, concurrently with the step of forming source and drain regions.

In any event, the ultimate width of the insulated gate thereby produced is determined by thickness of the original conductor film. That is, the deposition of a one micron conductor film produces a gate width of approximately one micron. It can readily be appreciated that gate widths as small as 500 angstroms are thereby achievable.

FIGS. 1–5 are greatly enlarged cross sectional views illustrating successive steps in accordance with the method of the invention.

In FIG. 1, a monocrystalline silicon substrate 11 of p-type conductivity and high resistivity is provided with a surface layer 12 of silicon oxide. Preferably, layer 12 is provided by thermal oxidation, but may also be provided by known deposition techniques. Layer 12 is then selectively thinned by vertical etching, to provide a vertical step 14, which can be done with conventional photolithography. For example, the use of a plasma etch comprising a perflouro compound of the general class $C_n F_{2n+2}$ has been found suitable. $C_3F_8$, for example, is a preferred etch composition. The remaining thin portion 13 has a thickness selected in accordance with the gate insulation requirements of the device ultimately to be fabricated. As noted earlier, thin portion 13 is preferably a regrown layer, provided after complete removal of the original layer in the selected area. A redeposited layer is also feasible.

Figure 2:
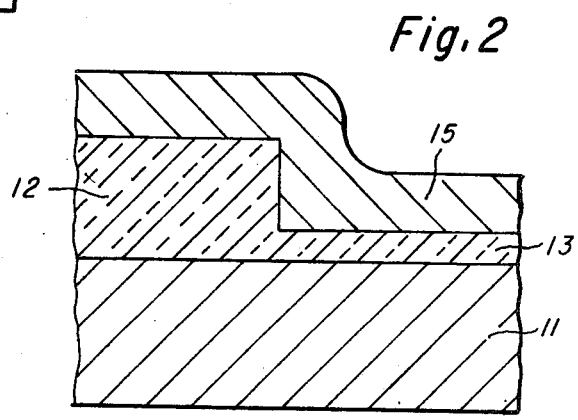

As shown in FIG. 2, the next step is to deposit conductor film 15 having a thickness which corresponds approximately to the desired width of the final gate structure. For example, layer 15 is comprised of polycrystalline silicon deposited with the use of known techniques. It will be noted, for example, that layer 15 has a vertical thickness in the vicinity of step 14 that is approximately twice its thickness elsewhere on the insulation layer.

Figure 3:
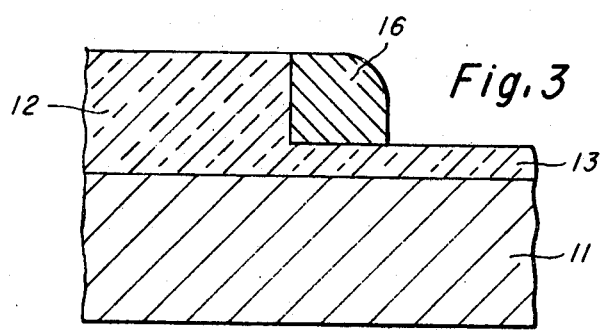

Next, as shown in FIG. 3, anisotropic etching of layer 15 is continued until the only remaining portion thereof is a narrow section 16 that remains in the vicinity of step 14. A suitable etchant for thinning the polycrystalline silicon has the general formula $CCl_xF_y$ where the sum of X and Y is 4. That is, where X=4 and Y=0, the preferred example is carbon tetrachloride employed in a plasma form.

Figure 4:
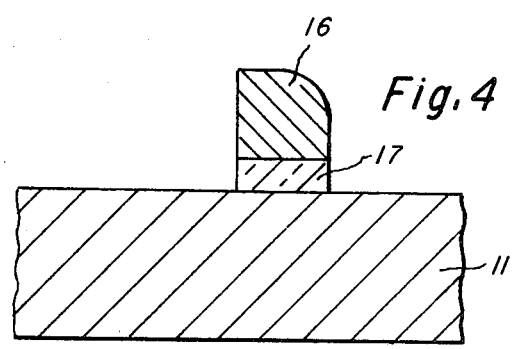

Next, as shown in FIG. 4, the resulting polycrystalline silicon 16 is employed as an etch mask in the removal of all remaining silicon oxide, except a narrow section 17 which lies immediately below polysilicon 16. Again, a suitable etch for use in this step is the $C_3F_8$ etch employed in the earlier step of etching the silicon oxide. Of course, the etch is preferential for the oxide in the presence of the polysilicon.

Figure 5:
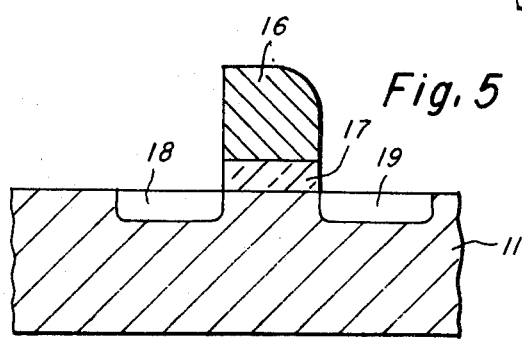

Then, if the gate is to be employed in the fabrication of an MOS transistor, the gate structure is suitably employed as a mask in the selective doping of regions 18 and 19 to provide n-type source and drain regions as shown in FIG. 5. Finally, suitable contacts are fabricated on the source and drain regions, thereby completing an MOS transistor. Of course, functional circuitry requires isolation between devices, as well as insulation between gates and other conductors, not shown. Such additional features are well-known and need not be repeated.

Although the invention has been described in the context of a conductor patterned on an insulator, it will be apparent that one conductor can be patterned on another conductor; or that one insulator can be patterned on another insulator. It is essential, however, that an etchant be selected to provide selectivity of attack for the material to be etched, and relative inactivity toward the overlying material which serves as the mask for removal of first layer material not covered by second layer material. Preferably, as stated above, vertical sidewalls are formed in each selective etching step. For example, silicon nitride is patterned on silicon oxide; or aluminum is patterned on polycrystalline silicon.

The invention is specifically illustrated by forming an insulated gate of polycrystalline silicon on silicon dioxide, patterned on a p-type monocrystalline silicon substrate. First, a 1500 Å layer of silicon oxide is thermally grown on the substrate, followed by known KMER photolithography to selectively remove a portion of the oxide and thereby form a vertical side-walled step between the masked and unmasked areas. The vertical etch step is carried out with a plasma-reactive sputter etch vapor comprising $C_3F_8$ at 0.4 torr and 600 watts of RF power, in a reactor described in U.S. Pat. No. 3,757,733. A thin layer of high-quality silicon dioxide is then grown on the exposed silicon to partially replace the removed portion.

A 1000 Å layer of polycrystalline silicon is then deposited across the vertical $SiO_2$ edge, followed by anisotropic etching of the polysilicon with a plasma etch vapor comprising $CCl_4+HCl+N_2$ in a ratio of 25:18:10 by volume, using a pressure of 0.26 torr at 600 watts RF power. Other etch compositions and process parameters are also obviously useful.

When the only remaining polysilicon lies adjacent the vertical edge, its width approximates the thickness of the original polysilicon deposit. A plasma vapor selective for silicon oxide in the presence of silicon is then used to remove all remaining oxide not covered by the silicon. $C_3F_8+CF_4$ vapor at 0.6 torr and 600 watts is employed to eliminate or minimize undercutting. An insulated gate having a width of about 1000 Å is thereby achieved. An MOS type transistor is then completed by implanting phosphorous or arsenic ions to form source and drain regions, and then forming contact electrodes to source, drain and gate areas.

For more information about anisotropic plasma-reactive etching processes, see Matsuo and Takehara, Japanese Journal of Applied Physics, Vol. 16 (1977) No. 1, pp. 175–6.

I claim:

1. A method for the fabrication of an insulated gate semiconductor device comprising the steps of:
   (a) forming an adherent insulation layer on a semiconductor substrate;
   (b) selectively thinning a portion of said insulation layer to provide a substantially vertical step at the location where the resulting thin portion adjoins the original thick portion;
   (c) depositing a conductor film of micron or submicron thickness, on and near said vertical steps;
   (d) thinning at least a portion of said conductor film until the only portion thereof remaining in the vicinity of said step is a narrow section directly adjacent said step, on the thin portion of said insulation layer;
   (e) using the remaining conductor as a mask, selectively removing the insulation not covered by the conductor, whereby an insulated gate is formed;
   (f) and then completing said device.

2. A method as in claim 1 wherein said vertical step is provided by selectively etching to remove the thinned portion, followed by regrowing or depositing a thin layer to partially replace the removed portion.

3. A method as in claim 1 wherein said semiconductor is silicon and said insulation layer is silicon oxide.

4. A method as in claim 1 wherein said conductor comprises doped polycrystalline silicon.

5. A method as in claim 1 wherein said device comprises an MOS field effect device, said semiconductor comprises monocrystalline silicon, said insulation layer comprises silicon oxide, and said conductor comprises doped polycrystalline silicon.

6. A method as in claim 1 wherein the gate width is less than one micron.

7. A method as in claim 5 wherein the gate width is less than one micron.

8. A method of fabricating an insulted conductor gate on a semiconductor substrate comprising:
   (a) selectively etching an insulating layer on a surface of a semiconductor substrate so as to form two thickness levels of the insulating layer and a vertical edge therebetween;
   (b) forming a conductive layer covering the vertical edge and adjacent insulating layer;

(c) vertically etching said conductor so as to expose the insulating layer lying thereunder except that conductor adjacent the vertical edge, whereby a region of conductor results overlying a portion of the insulating layer, the region of said conductor having a length approximately equal to the initial thickness of the conductive layer;

(d) then vertically etching the insulator not covered by the conductor, until all such insulator is removed, leaving only an insulated conductor gate for use in fabricating a semiconductor device.

9. A method of fabricating insulative gates on a semiconductor substrate as recited in claim 7 wherein the insulating layer consists of silicon dioxide.

10. A method of fabricating insulative gates on a semiconductor substrate as recited in claim 8 wherein the conductive layer is selected from polysilicon, aluminum, refractive metals, and metal silicides.

* * * * *